United States Patent
Shinohara

(10) Patent No.: US 10,175,544 B2
(45) Date of Patent: *Jan. 8, 2019

(54) CONNECTION BODY, METHOD FOR MANUFACTURING A CONNECTION BODY, CONNECTING METHOD AND ANISOTROPIC CONDUCTIVE ADHESIVE AGENT

(71) Applicant: DEXERIALS CORPORATION, Tokyo (JP)

(72) Inventor: Seiichiro Shinohara, Kanuma (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/112,263

(22) PCT Filed: Jan. 13, 2015

(86) PCT No.: PCT/JP2015/050619
§ 371 (c)(1),
(2) Date: Jul. 18, 2016

(87) PCT Pub. No.: WO2015/108025
PCT Pub. Date: Jul. 23, 2015

(65) Prior Publication Data
US 2016/0327826 A1 Nov. 10, 2016

(30) Foreign Application Priority Data
Jan. 16, 2014 (JP) ................................ 2014-006285

(51) Int. Cl.
*G02F 1/1345* (2006.01)
*H05K 3/32* (2006.01)
(Continued)

(52) U.S. Cl.
CPC ........... *G02F 1/13452* (2013.01); *H01B 1/22* (2013.01); *H01L 23/544* (2013.01); *H01L 24/16* (2013.01);
(Continued)

(58) Field of Classification Search
USPC .......................................... 361/767; 257/778
See application file for complete search history.

(56) References Cited

U.S. PATENT DOCUMENTS 5,685,939 A * 11/1997 Wolk ................ H01L 23/49883
156/234
8,546,257 B2 * 10/2013 Kraus .............. G01N 33/54366
257/780
(Continued)

FOREIGN PATENT DOCUMENTS

JP 2007-80522 A 3/2007
JP 2009-535843 A 10/2009
(Continued)

OTHER PUBLICATIONS

Mar. 31, 2015 Search Report issued in International Patent Application No. PCT/JP2015/050619.
(Continued)

*Primary Examiner* — Andargie M Aychillhum
(74) *Attorney, Agent, or Firm* — Oliff PLC

(57) ABSTRACT

Ensure conduction between an electronic component and a circuit substrate having reduced pitches in wiring of the circuit substrate or electrodes of the electronic component and prevent short circuits between electrode terminals of the electronic component. A connection body including an electronic component connected to a circuit substrate via an anisotropic conductive adhesive agent containing conductive particles; wherein the conductive particles are regularly arranged; and wherein the conductive particles have a par-
(Continued)

ticle diameter that is ½ or less than a height of a connecting electrode of the electronic component.

10 Claims, 5 Drawing Sheets

(51) Int. Cl.
*H01B 1/22* (2006.01)
*H01L 23/544* (2006.01)
*H05K 1/18* (2006.01)
*H01L 23/00* (2006.01)

(52) U.S. Cl.
CPC .............. *H01L 24/17* (2013.01); *H01L 24/29* (2013.01); *H01L 24/32* (2013.01); *H01L 24/73* (2013.01); *H01L 24/81* (2013.01); *H01L 24/83* (2013.01); *H01L 24/92* (2013.01); *H05K 1/181* (2013.01); *H05K 3/323* (2013.01); *H05K 3/325* (2013.01); *H01L 24/13* (2013.01); *H01L 24/14* (2013.01); *H01L 24/27* (2013.01); *H01L 2223/54426* (2013.01); *H01L 2223/54473* (2013.01); *H01L 2223/54486* (2013.01); *H01L 2224/13082* (2013.01); *H01L 2224/13144* (2013.01); *H01L 2224/13147* (2013.01); *H01L 2224/13644* (2013.01); *H01L 2224/14133* (2013.01); *H01L 2224/14135* (2013.01); *H01L 2224/16227* (2013.01); *H01L 2224/27003* (2013.01); *H01L 2224/27334* (2013.01); *H01L 2224/294* (2013.01); *H01L 2224/2929* (2013.01); *H01L 2224/2936* (2013.01); *H01L 2224/2939* (2013.01); *H01L 2224/2949* (2013.01); *H01L 2224/29311* (2013.01); *H01L 2224/29316* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/29357* (2013.01); *H01L 2224/29371* (2013.01); *H01L 2224/29387* (2013.01); *H01L 2224/29388* (2013.01); *H01L 2224/29393* (2013.01); *H01L 2224/29486* (2013.01); *H01L 2224/29499* (2013.01); *H01L 2224/32225* (2013.01); *H01L 2224/73204* (2013.01); *H01L 2224/75252* (2013.01); *H01L 2224/75301* (2013.01); *H01L 2224/75981* (2013.01); *H01L 2224/8113* (2013.01); *H01L 2224/81132* (2013.01); *H01L 2224/81191* (2013.01); *H01L 2224/81488* (2013.01); *H01L 2224/81903* (2013.01); *H01L 2224/8313* (2013.01); *H01L 2224/83101* (2013.01); *H01L 2224/83132* (2013.01); *H01L 2224/83192* (2013.01); *H01L 2224/83203* (2013.01); *H01L 2224/83851* (2013.01); *H01L 2224/83855* (2013.01); *H01L 2224/83862* (2013.01); *H01L 2224/83874* (2013.01); *H01L 2224/9211* (2013.01); *H01L 2924/0635* (2013.01); *H01L 2924/0665* (2013.01); *H01L 2924/1426* (2013.01); *H01L 2924/381* (2013.01); *H05K 2201/0221* (2013.01); *H05K 2201/0233* (2013.01); *H05K 2201/10734* (2013.01); *H05K 2203/166* (2013.01)

(56) References Cited

U.S. PATENT DOCUMENTS

| | | | | |
|---|---|---|---|---|
| 2007/0001313 | A1* | 1/2007 | Fujimoto | ................ H01L 24/11 257/778 |
| 2010/0285305 | A1* | 11/2010 | Akutsu | ................... H01L 24/83 428/323 |
| 2011/0254568 | A1* | 10/2011 | Thomas | ............... G01N 27/227 324/663 |
| 2013/0120948 | A1* | 5/2013 | Sato | ........................ H01L 24/81 361/773 |

FOREIGN PATENT DOCUMENTS

| | | |
|---|---|---|
| JP | 2010-251336 A | 11/2010 |
| JP | 4789738 B2 | 10/2011 |
| TW | 201332070 A | 8/2013 |
| WO | 2013/089199 A1 | 6/2013 |
| WO | 2013/146573 A1 | 10/2013 |

OTHER PUBLICATIONS

Aug. 11, 2016 International Preliminary Report on Patentability issued in International Patent Application No. PCT/JP2015/050619.

* cited by examiner

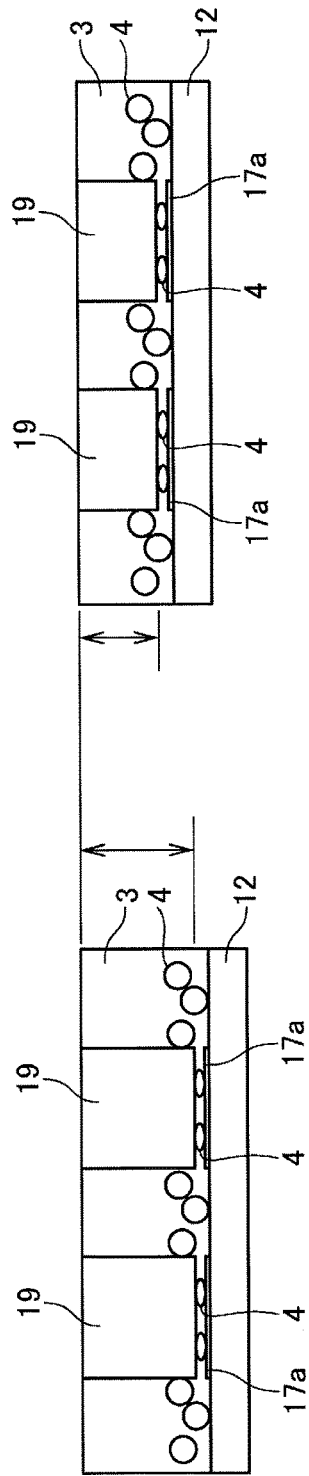

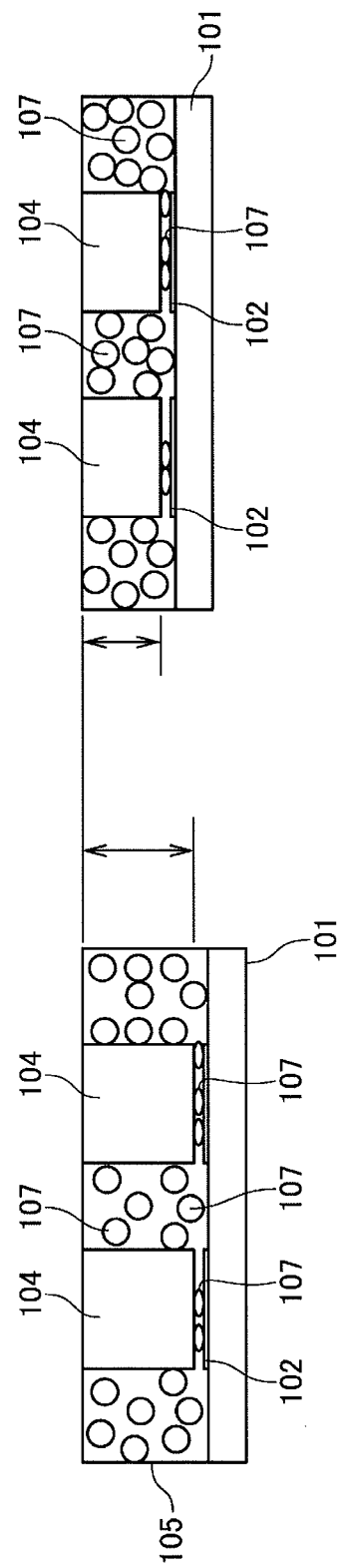

CONNECTION BODY, METHOD FOR MANUFACTURING A CONNECTION BODY, CONNECTING METHOD AND ANISOTROPIC CONDUCTIVE ADHESIVE AGENT

TECHNICAL FIELD

The present disclosure relates to a connecting method of an electronic component and a circuit substrate, and more particularly relates to a connection body, a method for manufacturing a connection body, a connecting method for connecting an electronic component and an anisotropic conductive adhesive in which an electronic component is connected to a circuit substrate via an adhesive agent containing conductive particles. This application claims priority to Japanese Patent Application No. 2014-6285 filed on Jan. 16, 2014, the entire contents of which are hereby incorporated by reference.

BACKGROUND ART

Conventionally, devices such as televisions, PC monitors, mobile phones, smart phones, portable game devices, tablet devices, wearable devices and automotive monitors, among others, have used a liquid crystal display device or an organic EL panel as a display means. In recent years, in such display devices, in view of finer pitches and thinner and lighter devices, mounting of driver ICs directly onto glass substrates of display panels, which is known as COG (chip on glass), has been employed.

For example, in a liquid crystal display panel in which COG mounting is employed, as shown in FIG. 6A and FIG. 6B, a plurality of transparent electrodes 102 made from, among other materials, ITO (indium tin oxide), are formed onto a transparent substrate 101 made from, for example, a glass substrate, and an electronic component such as a liquid crystal driver IC 103 is connected onto these transparent electrodes 102. The liquid crystal driver IC 103 has electrode terminals 104 corresponding to the transparent electrodes 102 formed onto the mounting surface thereof and is thermocompression-bonded onto the transparent substrate 101 via an anisotropic conductive film 105, thereby connecting the electrode terminals 104 to the transparent electrodes 102.

The anisotropic conductive film 105 contains a binder resin into which conductive particles are dispersed, and is film-formed, and by being thermocompression-bonded between two conductors, electrical conduction between the conductors is achieved by the conductive particles and mechanical connection between the conductors is ensured between the conductors by the binder resin. The adhesive agent constituting the anisotropic conductive film 105, although typically a highly reliable thermosetting binder resin is used, may be a photosetting binder resin or a thermo/photosetting binder resin.

In the case of connecting the liquid crystal driver IC 103 to the transparent electrodes 102 via such an anisotropic conductive film 105, the anisotropic conductive film 105 is first temporarily bonded onto the transparent electrodes 102 of the transparent substrate 101 by a temporary pressure bonding means which is not illustrated in the drawings. After mounting the liquid crystal driver IC 103 onto the transparent substrate 101 via the anisotropic conductive film 105 to form a temporary connection body, a thermocompression bonding means, for example, a thermocompression bonding head 106, is used to hot-press the liquid crystal driver IC 103 along with the anisotropic conductive film 105 towards the transparent substrate 102. Heat applied by the thermocompression bonding head 106 causes a thermosetting reaction in the anisotropic conductive film 105, thereby connecting the liquid crystal driver IC 103 onto the transparent electrodes 102.

PRIOR ART LITERATURE

Patent Literatures

PLT 1: Japanese Patent No. 4789738
PLT 2: Japanese Translation of PCT International Application Publication No. 2009-535843

SUMMARY OF THE INVENTION

Problem to be Solved by the Invention

In recent years, along with size reductions and advanced functionality in liquid crystal displays and other electronic devices, size and height reductions are desired and electrode terminals 104 known as bumps are being reduced in height. Additionally, progress has been made in making finer pitches for wiring of circuit substrates and electrode terminals of electronic components and, in the case of using an anisotropic conductive film to COG connect an electronic component such as an IC chip to a circuit substrate having a reduced electrode pitch, in order to certainly sandwich the conductive particles to ensure conduction in the case of narrowed intervals between electrode terminals, filling the conductive particles at a high concentration is necessary.

However, as illustrated in FIG. 7, if the electrode terminals 104 are reduced in height and conductive particles 107 are filled at a high density, inter-terminal short circuit occurrence rates are increased among the electrode terminals 104. Thus, as illustrated in FIG. 7A, in the case of the electrode terminals 104 having a conventional height, because a large inter-terminal surface area is secured across a wide area, even in the case of filling the conductive particles 107 at a high density, inter-terminal short circuit problems, which are caused by the conductive particles 107 dispersed between the electrodes becoming continuous, have not occurred. Thus, it had been possible to improve conductivity by filling the conductive particles 107 at a high density and prevent inter-terminal short circuits.

However, as illustrated in FIG. 7B, in the electrode terminals 104 having a reduced height, because inter-terminal surface area is reduced, in the case of using an anisotropic conductive film in which the conductive particles 107 are filled at a high density, the conductive particles 107 become continuous in inter-terminal areas and inter-terminal short circuits occur. It should be noted that, generally, because electrodes formed on circuit substrates are formed by, among other methods, printing at thicknesses in the order of several tens of nanometers to several micrometers, circuit substrate-side inter-electrode short circuits are not a problem.

Thus, an object of the present disclosure is to provide a connection body, a method for manufacturing a connection body, a method for connecting an electronic component, and an anisotropic conductive adhesive agent which, even in the case of a reduced pitch in wiring of a circuit board and/or electrode terminals of an electronic component, can ensure electrical conduction between the electronic component and the circuit substrate and prevent short circuits between electrode terminals of the electronic component.

Solution to Problem

In order to solve the aforementioned problems, a connection body according to the present disclosure comprises an electronic component connected onto a circuit substrate via an anisotropic conductive adhesive agent; wherein the anisotropic conductive adhesive agent has conductive particles that are regularly arranged; and wherein the conductive particles have a particle diameter that is ½ or less than a height of a connecting electrode of the electronic component.

Further, a method for manufacturing a connection body according to the present disclosure comprises mounting an electronic component onto a circuit substrate via an adhesive agent containing conductive particles; and pressing the electronic component against the circuit substrate and curing the adhesive agent, thereby connecting the electronic component to the circuit substrate; wherein the anisotropic conductive adhesive agent has conductive particles that are regularly arranged; and wherein the conductive particles have a particle diameter that is ½ or less than a height of a connecting electrode of the electronic component.

Still further a connecting method of an electronic component according to the present disclosure comprises mounting an electronic component onto a circuit substrate via an adhesive agent containing conductive particles; and pressing the electronic component against the circuit substrate and curing the adhesive agent, thereby connecting the electronic component to the circuit substrate; wherein the anisotropic conductive adhesive agent has conductive particles that are regularly arranged; and wherein the conductive particles have a particle diameter that is ½ or less than a height of a connecting electrode of the electronic component.

Yet further, an anisotropic conductive adhesive agent to be pasted, along with mounting of an electronic component, to a surface of a circuit substrate as an anisotropic conductive adhesive agent for connecting the electronic component to the circuit substrate comprises conductive particles in a regular arrangement; wherein the conductive particles have a particle diameter that is ½ or less than a height of a connecting electrode of the electronic component.

Advantageous Effects of Invention

According to the present disclosure, because the conductive particles of the anisotropic conductive adhesive agent are regularly arranged and diameter of the conductive particles is at most ½ of the height of the connecting electrodes of the electronic component, agglomeration of the conductive particles does not occur between the connecting electrodes and distance between particles is maintained. Therefore, even in the case of a reduced cross-sectional area between the connecting electrodes, inter-terminal short circuits can be prevented.

BRIEF DESCRIPTION OF DRAWINGS

FIG. 5A is a cross-sectional view illustrating a connected state of an IC chip which has electrode terminals having a conventional height and FIG. 5B is a cross-sectional view illustrating a connected state of an IC chip which has electrode terminals having a reduced height according to the present disclosure.

FIG. 7A is a cross-sectional view illustrating a connected state of an IC chip which has electrode terminals having a conventional height and FIG. 7B is a cross-sectional view illustrating a connected state of an IC chip which has electrode terminals having a reduced height according to a conventional configuration.

DESCRIPTION OF EMBODIMENTS

Figure 1:
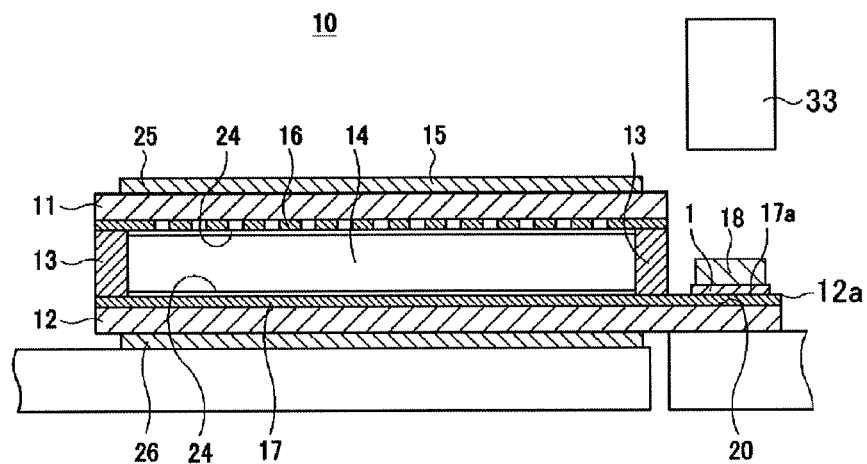
FIG. 1 is a cross-sectional view illustrating one example of a connection body of a liquid crystal display panel.

Hereinbelow, a connection body, a method for manufacturing a connection body, a connecting method and an anisotropic conductive adhesive agent will now be more particularly described according to the following order with reference to the accompanying drawings. It should be noted that the present disclosure is not limited to the embodiments described below and various modifications can be made without departing from the scope of the present invention. The features shown in the drawings are illustrated schematically and are not intended to be drawn to scale. Actual dimensions should be determined in consideration of the following description. Moreover, those skilled in the art will appreciate that dimensional relations and proportions may be different among the drawings in some parts.

Liquid Crystal Display Panel

In the following, a case will be described as an example in which, as a connection body according to the present disclosure, a liquid crystal driver IC chip is mounted as the electronic component to a glass substrate of a liquid crystal display panel. As illustrated in FIG. 1, a liquid crystal display panel 10, in which two transparent substrates 11, 12 made from a material such as a glass substrate are arranged to face each other and these transparent substrates 11, 12 are joined together by a seal 13 which is frame-shaped. In the liquid crystal display panel 10, a panel display component 15 is formed by sealing a liquid crystal 14 within a space enclosed by the transparent substrates 11, 12.

On both inner surfaces of the transparent substrates 11, 12 opposing each other, a pair of transparent electrodes 16, 17 are formed from, for example, ITO (indium tin oxide) in a stripe pattern in mutually intersecting directions. Both of the transparent electrodes 16, 17 are configured so that a pixel, as the minimum unit of the liquid crystal display, is constituted by intersecting portions of both of the transparent electrodes 16, 17.

Among both of the transparent substrates 11, 12, one transparent substrate 12 is formed to be larger than the other transparent substrate 11 in planar dimensions, and in an edge area 12a of the transparent substrate 12 formed to be larger, a COG mounting portion 20 is provided on which a liquid crystal driver IC 18 is mounted as the electronic component. It should be noted that, on the COG mounting portion 20, terminal portions 17a of the transparent electrodes 17 and a substrate-side alignment mark 21, which is to be superimposed with an IC-side alignment mark 22 provided on the liquid crystal driver IC 18, are formed.

Figure 2:
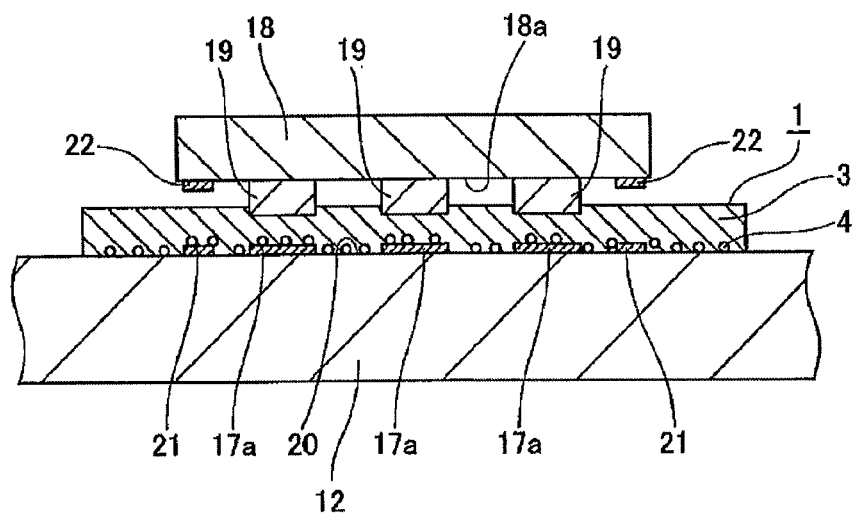
FIG. 2 is a cross-sectional view illustrating a connecting step of a liquid crystal driver IC and a transparent substrate.

The liquid crystal driver IC 18, by selectively applying a liquid crystal driving voltage to the pixel, can partially change liquid crystal orientation to perform a selected liquid crystal display. As illustrated in FIG. 2, the liquid crystal driver IC 18 has a mounting surface 18*a* which faces the transparent substrate 12 and on which electrode terminals 19 (bumps) are formed for electrically connecting to terminal portions 17*a* of the transparent substrate 17. Suitable examples usable as the electrode terminals 19 include copper bumps, gold bumps and gold-plated copper bumps, among others.

Electrode Terminals

In the electrode terminals 19, for example, input bumps are arranged in a single line along an edge side of the mounting surface 18*a* and output bumps are arranged in a staggered fashion in multiple rows along another edge side that is opposite to the edge side. The transparent electrodes 19 and the terminal portions 17*a* formed on the COG mounting portion 20 of the transparent substrate 12 are formed in equal number and at equal pitch and are connected by positioning and connecting the transparent substrate 12 and the liquid crystal driver IC 18.

It should be noted that, recently, along with size reductions and advanced functionality in liquid crystal displays and other electronic devices, size reductions and height reductions are desired in electronic components such as the liquid crystal driver IC 18 and height of the terminal electrodes 19 is also reduced (to, for example, 6 to 15 μm).

Furthermore, on the mounting surface 18*a* of the liquid crystal driver IC 18, an IC-side alignment mark 22 is formed for performing alignment with respect to the transparent substrate 12 by superimposing with the substrate-side alignment mark 21. It should be noted that, due to progress in finer wiring pitches for the transparent electrodes 17 of the transparent substrate 12 and the electrode terminals 19 of the liquid crystal driver IC 18, a high accuracy is desired in alignment of the liquid crystal driver IC 18 and the transparent substrate 12.

As the substrate-side alignment mark 21 and the IC-side alignment mark 22, a variety of marks can be used which can be combined together to align the transparent substrate 12 and the liquid crystal driver IC 18.

On the terminal portions 17*a* of the transparent electrodes 17 formed on the COG mounting portion 20, the liquid crystal driver IC 18 is connected by using an anisotropic conductive film 1 as a circuit connecting-use adhesive agent. The anisotropic conductive film 1 contains conductive particles 4 and is for electrically connecting the electrode terminals 19 of the liquid crystal driver IC 18 to the terminal portions 17*a* of the transparent electrodes 17 formed on the edge area 12*a* of the transparent substrate 12 via the conductive particles 4. In the anisotropic conductive film 1, binder resin flows due to thermocompression bonding with the thermocompression bonding head 33 and the conductive particles 4 are deformed between the terminal portions 17*a* and the electrode terminals 19 of the liquid crystal driver IC 18 and the binder resin is cured in this state. The anisotropic conductive film 1 thus mechanically and electrically connects the transparent substrate 12 and the liquid crystal driver IC 18.

Further, on both the transparent electrodes 16, 17, an orientation film 24 that is subjected to a predetermined rubbing treatment is formed and an initial orientation of the liquid crystal molecules is regulated by this orientation film 24. Further, on both the transparent electrodes 16, 17, an orientation film subjected to a selected rubbing treatment is formed so that the initial orientation of the liquid crystal molecules is regulated by an alignment film 24. Still further, a pair of polarizing plates 25, 26 are disposed on the outer surfaces of the transparent substrates 11, 12; these polarizing plates 25, 26 regulate the wave-direction of transmitted light from a light source such as a backlight (not illustrated).

Anisotropic Conductive Film

Figure 3:
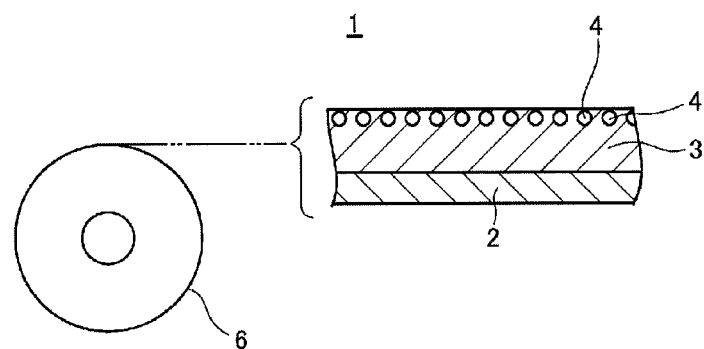
FIG. 3 is a cross-sectional view illustrating an anisotropic conductive film.

Next, the anisotropic conductive film 1 will be described. In the anisotropic conductive film (ACF) 1, as illustrated in FIG. 3, typically, a binder resin layer (adhesive layer) 3 containing the conductive particles 4 is formed on a release-treated film 2 serving as a matrix material. The anisotropic conductive film 1 is an adhesive agent of a thermosetting-type or a photocurable-type such as by ultraviolet light and is pasted onto the transparent electrodes 17, which are formed on the transparent substrate 12 of the liquid crystal display panel 10, along with mounting the liquid crystal driver IC 18; flowing is caused by thermocompression-bonding by the thermocompression bonding head 33 and the conductive particles 4 are deformed between the terminal portions 17*a* of the respectively opposing transparent electrodes 17 and the electrode terminals 19 of the liquid crystal driver IC 18; heat is then applied or ultraviolet light is irradiated in order to cure the resin in a state in which the conductive particles are deformed. The anisotropic conductive film 1 is thus able to connect and conduct electricity between the transparent substrate 12 and the liquid crystal driver IC 18.

Further, in the anisotropic conductive film 1, in the binder resin layer 3 which contains, as typical, a film-forming resin, a thermosetting resin, a latent curing agent and a silane coupling agent, the conductive particles 4 are regularly arranged in a predetermined pattern.

The release-treated film 2 for supporting the binder resin layer is formed by coating, for example, PET (polyethylene terephthalate), OPP (oriented polypropylene), PMP (poly-4-methylpentene-1), PTFE (polytetrafluoroethylene), among others, with a release agent such as silicone, and is for preventing drying of the anisotropic conductive film 1 and maintaining the shape of the anisotropic conductive film 1.

As the film-forming resin contained by the binder resin layer 3, a resin having an average molecular weight of approximately 10,000 to 80,000 is preferably used. Examples of film forming resin include epoxy resin, modified epoxy resin, urethane resin and phenoxy resin, among a wide variety of other resins. Among these, in view of such properties as resin-formed states and connection reliability, a phenoxy resin is particularly preferable.

Examples of thermosetting resins, without particular limitation, include commercially available epoxy resins and acrylic resins.

Examples of epoxy resin include, without particular limitation, naphthalene-type epoxy resin, biphenol-type epoxy resin, phenol-novolac type epoxy resin, bisphenol type epoxy resin, stilbene-type epoxy resin, triphenolmethane-type epoxy resin, phenol aralkyl-type epoxy resin, naphthol-type epoxy resin, dicyclopentadiene-type epoxy resin and triphenylmethane-type epoxy resin, among others. These may be used individually or in a combination of two or more.

Acrylic resin is without particular limitation and an acrylic compound and/or a liquid acrylate, among others, may be selected as appropriate according to purpose. Examples include methyl acrylate, ethyl acrylate, isopropyl acrylate, isobutyl acrylate, epoxy acrylate, ethylene glycol diacrylate, diethylene glycol diacrylate, trimethylol propane triacrylate, dimethylol tricyclodecane diacrylate, tetramethylene glycol tetraacrylate, 2-hydroxy-1,3-diacryloxy propane, 2,2-bis[4-(acryloxy) phenyl] propane, 2,2-bis[4-(acryloxy ethoxy) phenyl] propane, dicyclopentenyl acrylate, tricyclodecanyl acrylate, tris(acryloxyethyl) isocyanurate, urethane acrylate and epoxy acrylate, among others. It should be noted that methacrylate may be substituted for acrylate. These may be used individually or in a combination of two or more.

The latent curing agent is without particular limitation and examples include thermosetting and UV-curing types, among a variety of other types of curing agents. The latent curing agent does not react under normal conditions and a trigger including heat, light and/or pressure, among others, for activation/initiating a reaction can be selected according to need. Existing methods for activating a heat activated latent curing agent include methods in which active species (cations, anions and/or radicals) are generated by a dissociative reaction due to heat, methods in which the curing agent is stably dispersed in the epoxy resin, the curing agent becomes compatible with and dissolves in the epoxy resin at high temperatures and the curing reaction is initiated, methods in which a molecular sieve enclosed type curing agent is dissolved at a high temperature to initiate the curing reaction and methods in which microcapsules are dissolved to cure, among other methods. Examples of latent curing agents include imidazole-type, hydrazide-type, boron trifluoride-amine complexes, sulfonium salt, aminimide, polyamine salt and dicyandiamide, among others, and modified compounds of these; these may be used individually or in a combination of two or more. Among these, a microcapsule imidazole-type latent curing agent is particularly suitable.

The silane coupling agent is without particular limitation and examples include epoxy-type, amino-type, mercapto/sulfide-type, and ureido-type, among others. By adding the silane coupling agent, adhesion properties at interfaces between organic and inorganic materials can be improved.

Conductive Particles

Examples of conductive particles 4 usable in the anisotropic conductive film 1 include known conductive particles used in anisotropic conductive films. As the conductive particles 4, examples include particles of metals or metal alloys such as those of nickel, iron, copper, aluminum, tin, lead, chromium, cobalt, silver or gold and particles such as those of metal oxides, carbon, graphite, glass, ceramics and plastics coated with metal, or the above-mentioned particles further coated with a thin electrically-insulating film, among others. In the case of coating a metal to the surface of resin particles, examples of usable resin particles include phenol resin, acrylic resin, acrylonitrile-styrene (AS) resin, benzoguanamine resin, divinylbenzene-type resin and styrene-type resin particles, among others.

It should be noted that, due to progress in finer pitches for wiring of the transparent electrodes 17 of the transparent substrate 12 and electrode terminals 19 of the liquid crystal driver IC 18, in the case of COG connecting the liquid crystal driver IC 18 onto the transparent substrate 12, in order to ensure sandwiching of the conductive particles 4 to ensure conduction in this case of a size-reduced inter-electrode terminal areas, the conductive particles 4 are filled at a high density (for example 16,000 particles/mm$^2$) in the anisotropic conductive film 1.

Regular Arrangement of Conductive Particles

Figure 4:
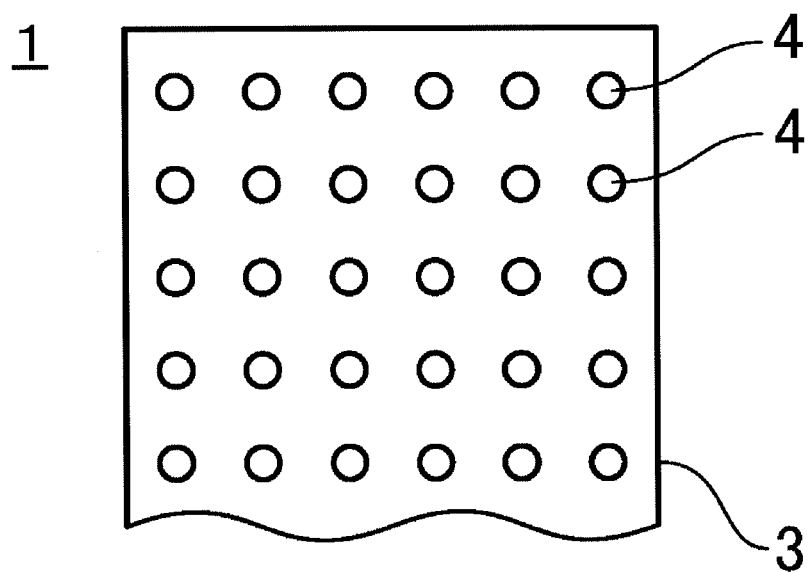
FIG. 4 is a plan view illustrating an anisotropic conductive film in which conductive particles are regularly arranged in a grid pattern.
Figure 6A:
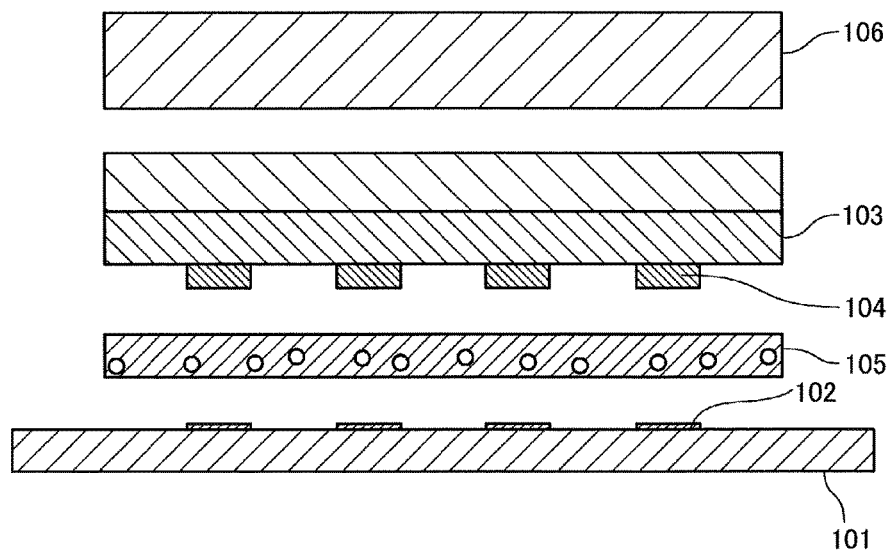
FIG. 6 is a cross-sectional view illustrating a step in which an IC chip is connected to a transparent substrate of a liquid crystal display panel.
Figure 6B:
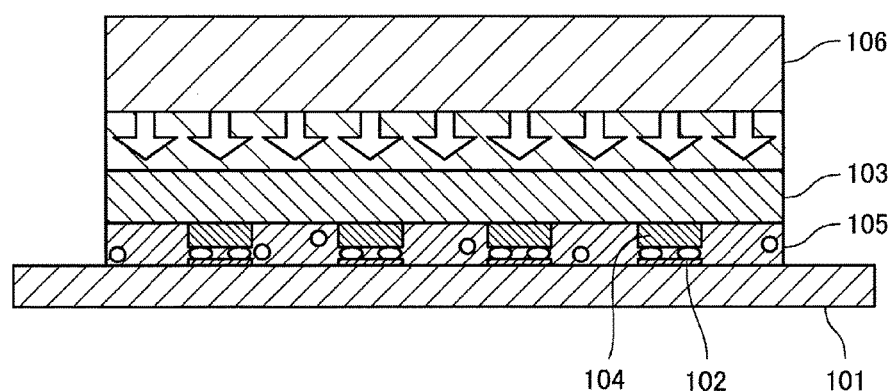

In the anisotropic conductive film 1, the conductive particles 4 are arranged in a predetermined regular pattern as viewed from a planar perspective, for example as illustrated in FIG. 4, in a uniformly spaced grid. By regularly arranging the conductive particles 4 as viewed from a planar perspective, in contrast with the case of randomly dispersing the conductive particles 4, even in the case of a reduced pitch between adjacent terminals, a reduced and narrowed inter-electrode surface area for the electrode terminals 19 of the liquid crystal driver IC 18, and the conductive particles 4 being filled at a high density, in the connecting step of the liquid crystal driver IC 18, the anisotropic conductive film 1 can prevent short circuits between the electrode terminals 19 caused by agglomeration of the conductive particles 4.

Further, regularly arranging the conductive particles 4 in the anisotropic conductive film 1 prevents unevenness in density due to agglomeration of the conductive particles 4, even in the case of filling the binder resin layer 3 at a high density. Therefore, with the anisotropic conductive film 1, the conductive particles 4 can be trapped even in the case of the terminal portions 17a and the electrode terminals 19 having reduced pitches. The uniformly spaced pattern arrangement of the conductive particles 4 can be selected from, for example, a tetragonal lattice and hexagonal lattice patterns, among others, as viewed from a planar perspective. The connecting step of the liquid crystal driver IC 18 is described in detail further below.

Such an anisotropic conductive film 1 can be manufactured by methods including, for example, methods of coating a pressure-sensitive adhesive agent onto a stretchable sheet and arranging the conductive particles 4 in a single layer thereon before stretching the sheet to a selected draw ratio, methods of adjusting the conductive particles 4 into a selected pattern on a base material and subsequently transferring the conductive particles 4 to the binder resin layer 3 which is supported by the release-treated film, and methods of supplying the conductive particles 4 via an arrangement plate having openings corresponding to the pattern, among others.

Particle Number Density

In the anisotropic conductive film 1, in order to ensure sandwiching between the electrode terminals 19 and the terminal portions 17a which have reduced pitches, the conductive particles 4 are filled in the binder resin layer at a high density and preferably a particle number density of the conductive particles 4 is 10,000 to 60,000 particles/mm$^2$. In the case of the particle number density being less than 10,000 particles/mm$^2$, the number of particles trapped between the electrode terminals 19 and the terminal portions 17a is reduced and electrical resistance is increased. Furthermore, in the case of the particle number density being more than 60,000 particles/mm$^2$, particles might become continuous within the reduced space between the electrode terminals 19 and might cause short circuits between adjacent electrode terminals 19.

It should be noted that the shape of the anisotropic conductive film 1 is without particular limitation, and, for example, as illustrated in FIG. 3, can be a long, tape shape windable around a winding reel 6 that can be used by cutting to a selected length.

In the embodiment described above, as an example, as the anisotropic conductive film 1, a film-formed adhesive film made from a thermosetting resin composition containing the binder resin 3 in which the conductive particles 4 were dispersed is described; however, the adhesive agent according to the present disclosure is not limited thereto, and, for example, a configuration is possible in which an insulating adhesive agent layer containing the binder resin 3 alone is laminated with a conductive particle-containing layer containing the binder resin 3 which contains the conductive particles 4 in a regular arrangement. Furthermore, in the anisotropic conductive film 1, in the case of regularly arranging the conductive particles 4 as viewed from a planar perspective, in addition to being arranged in a single layer as illustrated in FIG. 2, the conductive particles 4 may be regularly arranged as viewed from a planar perspective in a plurality of binder resin layers 3. Still further, in at least one layer of a multilayer structure of the anisotropic conductive film 1, the conductive particles 4 may be dispersed at a single, selected distance.

Connecting Step

A connecting step for connecting the liquid crystal driver IC 18 to the transparent substrate 12 will now be described in detail. First, the anisotropic conductive film 1 is temporarily pasted onto the COG mounting portion 20 having the terminal portions 17 of the transparent substrate 12 formed thereon. Next, the transparent substrate 12 is placed on a stage of a connecting device and the liquid crystal driver IC 18 is positioned on the transparent substrate 12 with the anisotropic conductive film 1 interposing therebetween.

Next, by using a thermocompression head 33 heated to a predetermined temperature for curing the binder resin layer 3 at a predetermined pressure and time, the liquid crystal driver IC 18 is thermocompression-bonded from above. The binder resin layer 3 of the anisotropic conductive film 1 thus exhibits flowability, and, while the binder resin layer 3 flows from between the mounting surface 18a of the liquid crystal driver IC 18 and the COG mounting portion 20 of the transparent substrate 12, the conductive particles 4 within the binder resin layer 3 are sandwiched and deformed between the electrode terminals 19 of the electrode terminals 18 and the terminal portions 17a of the transparent substrate 12.

Consequently, the electrode terminals 19 and the terminal portions 17a are electrically connected by the conductive particles 4 being sandwiched therebetween and, in this state, heat is applied by a thermocompression head 33 to cure the binder resin. This enables manufacturing of the liquid crystal display panel 10 in which conduction is ensured between the electrode terminals 19 of the liquid crystal driver IC 18 and the terminal portions 17a of the transparent substrate 12.

The conductive particles 4 which are not between the electrode terminals 19 and the terminal portions 17a are dispersed within the binder resin in the spaces between adjacent electrode terminals 19 and maintained in an electrically insulated state. Thus, electrical conduction only between the electrode terminals 19 for output of the liquid crystal driver IC 18 and the terminal portions 17a of the transparent substrate 12 is achievable. It should be noted that, as the binder resin, by using a rapid-curing radical polymerization-reaction type, it is possible to rapidly cure the binder resin with a short heating time. Additionally, the anisotropic conductive film 1 is not limited to thermosetting types and as long as pressure can be used in connection, a photosetting type or a thermo/photosetting type adhesive agent can be used.

Conductive Particle Diameter

According to the present disclosure, the particle diameter of the conductive particles 4 is at most ½ of the height of the electrode terminals 19 of the liquid crystal driver IC 18 described above. Even in the case of the conductive particles 4 coming into contact with one another between the electrode terminals 19 having a reduced pitch, inter-terminal short circuits can thereby be prevented.

As described above, recently, along with size reductions and advanced functionality in liquid crystal displays and other electronic devices, size reductions and height reductions are desired in the liquid crystal driver IC 18, height reductions of the terminal electrodes 19 lead to, as illustrated in FIG. 5A and FIG. 5B, reduced surface area between the electrode terminals 19 in adjacency.

According to the present disclosure, the conductive particles 4 of the anisotropic conductive film 1 are regularly arranged and the diameter of the conductive particles 4 is at most ½ of the height of the electrode terminals 19 of the liquid crystal driver IC 18 described above. Thus, in the liquid crystal display panel 10, it is possible to ensure trapping of the conductive particles and conduction between the electrode terminals 19 and the terminal portions 17a; between the electrode terminals 19 in adjacency, the conductive particles can be dispersed while maintaining a predetermined inter-particle distance in order to enable prevention of inter-electrode short circuits between the electrode terminals 19.

It should be noted, as previously described, the number density of the conductive particles 4 is preferably 10,000 to 60,000 mm/mm$^2$. By having this number density, in the liquid crystal display panel 10, in addition to preventing short circuits between the electrode terminals 19 which are narrowed and size-reduced, capture of the conductive particles 4 is ensured between the electrode terminals 19 and the terminal portions 17a having finer pitches, enabling improvements in conduction.

EXAMPLES

Examples of the present disclosure will now be described. In the present examples, anisotropic conductive films in which conductive particles were regularly arranged and anisotropic conductive films in which conductive particles were randomly arranged were used to manufacture sample connecting bodies in which an evaluation-use IC was connected to an evaluation-use glass substrate; numbers of conductive particles trapped between each electrode were counted and initial and post-reliability-test electrical resistances, and occurrence rates of short circuits between adjacent terminals were measured.

Anisotropic Conductive Film

In the binder resin layer of the anisotropic conductive film used to connect the evaluation-use IC, 60 pts. mass of a phenoxy resin (trade name: YP-50, manufactured by NIPPON STEEL & SUMIKIN CHEMICAL CO., LTD.), 40 pts mass of an epoxy resin (trade name: jER828, manufactured by Mitsubishi Chemical Corporation) and 2 pts. mass of a cation-type curing agent (trade name: SI-60L, manufactured by SANSHIN CHEMICAL INDUSTRY CO., LTD.) were added to a solvent to prepare a binder resin composition, this binder resin composition was applied to a release-treated film and baked.

Evaluation-Use IC

As an evaluation device, an evaluation-use IC having outer dimensions of 1.5×13 mm, thickness of 0.5 mm, bumps (Au-plated) surface area of 25×140 μm, and inter-bump space: 7.5 μm was used.

Evaluation-Use Glass Substrate

As an evaluation-use glass substrate to which the evaluation-use IC was connected, a glass was used which had outer dimensions of 30×50 mm and a thickness of 0.5 mm and an ITO pattern formed in a comb-like shape thereon at a size and pitch equivalent to the bumps on the evaluation-use IC.

The anisotropic conductive film was temporarily pasted to the evaluation-use glass substrate before mounting the evaluation-use IC while keeping alignment between the bumps of the evaluation-use IC and the wiring electrodes of the evaluation-use glass substrate; by thermocompression-bonding with a thermocompression head under conditions of 180° C., 80 MPa and 5 seconds, connection body samples were manufactured. In each of the connection body samples, the number of conductive particles trapped between the IC bumps and the substrate electrodes, initial and post-reliability-test electrical resistances, and occurrence rates of short circuits between adjacent bumps were measured.

In the number of conductive particles trapped between IC bumps and the substrate electrodes, in each of the connection body samples, the number of particles caught between a pair of an evaluation-use IC bump and an evaluation-use glass substrate electrode were counted for every IC bump and every substrate electrode, and the average number and minimum number were determined. Furthermore, initial electrical resistances and resistances after a reliability test (85° C., 85% RH and 500 hours) were measured. In the occurrence rates of short circuits between bumps, the numbers of short circuits occurring between evaluation-use IC bumps were counted.

Furthermore, in each of the samples, minimum distance between conductive particles (μm) and the maximum number of conductive particles existing between the bumps in a cross-sectional plane aligned with the direction of bump arrangement was counted.

Example 1

In Example 1, an anisotropic conductive film was used in which conductive particles were regularly arranged in the binder resin layer. The anisotropic conductive film used in Example 1 was manufactured by coating a pressure-sensitive adhesive agent onto a stretchable sheet and arranging the conductive particles 4 in a single layer thereon before stretching the sheet to a predetermined draw ratio and, in this state, laminating the binder resin layer. Conductive particles (trade name: AUL704, manufactured by Sekisui Chemical Co., Ltd.) having a diameter of 4 μm were used at a particle number density of 16,000 particles/mm$^2$.

Furthermore, the evaluation-use IC used in Example 1 had a bump height of 15 μm and cross-sectional area for inter-bump space was 112.5 μm$^2$ (15 μm×7.5 μm).

Example 2

Example 2 used an evaluation-use IC having a bump height of 12 μm and cross-sectional area for inter-bump space was 90 μm$^2$ (12 μm×7.5 μm) and other conditions were the same as in Example 1.

Example 3

Example 3 used an evaluation-use IC having a bump height of 8 μm and cross-sectional area for inter-bump space was 60 μm$^2$ (8 μm×7.5 μm) and other conditions were the same as in Example 1.

Example 4

In Example 4, conductive particles (trade name: AUL705, manufactured by Sekisui Chemical Co., Ltd.) having a diameter of 5 μm were used and manufacturing was performed as in Example 1 to obtain an anisotropic conductive film. Particle number density was 16,000 particles/mm$^2$.

Furthermore, the evaluation-use IC used in Example 4 had a bump height of 10 μm and cross-sectional area for inter-bump space was 75 μm$^2$ (10 μm×7.5 μm).

Example 5

Example 5 used the same type of conductive particles as Example 1 and manufacturing was performed as in Example 1 to obtain an anisotropic conductive film. Particle number density was 10,000 particles/mm$^2$.

Furthermore, the evaluation-use IC used in Example 5 had a bump height of 8 μm and cross-sectional area for inter-bump space was 60 μm$^2$ (10 μm×7.5 μm).

Example 6

In Example 6, conductive particles (trade name: AUL703, manufactured by Sekisui Chemical Co., Ltd.) having a diameter of 3 μm were used and manufacturing was performed as in Example 1 to obtain an anisotropic conductive film. Particle number density was 60,000 particles/mm$^2$.

Furthermore, the evaluation-use IC used in Example 6 had a bump height of 8 μm and cross-sectional area for inter-bump space was 60 μm$^2$ (10 μm×7.5 μm).

Comparative Example 1

In Comparative Example 1, conductive particles were dispersed in the binder resin composition and this was applied to a release-treated film and baked to obtain an anisotropic conductive film in which the conductive particles were randomly arranged. Conductive particles (trade name: AUL704, manufactured by Sekisui Chemical Co., Ltd.) having a diameter of 4 μm were used at a particle number density of 16,000 particles/mm$^2$.

Furthermore, the evaluation-use IC used in Comparative Example 1 had a bump height of 15 μm and cross-sectional area for inter-bump space was 112.5 μm$^2$ (15 μm×7.5 μm).

Comparative Example 2

Comparative Example 2 used an evaluation-use IC having a bump height of 8 μm and cross-sectional area for inter-bump space was 60 μm$^2$ (8 μm×7.5 μm) and other conditions were the same as Comparative Example 1.

Comparative Example 3

In Comparative Example 3, conductive particles (trade name: AUL705, manufactured by Sekisui Chemical Co., Ltd.) having a diameter of 5 μm were used and manufacturing was performed as in Comparative Example 1 to obtain an anisotropic conductive film. Particle number density was 16,000 particles/mm$^2$.

Furthermore, the evaluation-use IC used in Comparative Example 3 had a bump height of 8 μm and cross-sectional area for inter-bump space was 60 μm$^2$ (8 μm×7.5 μm).

TABLE 1

|  | Ex. 1 | Ex. 2 | Ex. 3 | Ex. 4 | Ex. 5 |
|---|---|---|---|---|---|
| Phenoxy Resin | 60 | 60 | 60 | 60 | 60 |
| Epoxy Resin | 40 | 40 | 40 | 40 | 40 |

TABLE 1-continued

|  |  | | | | | |
|---|---|---|---|---|---|---|
| Cation-Type Curing Agent | | 2 | 2 | 2 | 2 | 2 |
| Conductive Particles | Diameter: 3 μm | | | | | |
|  | Diameter: 4 μm | Uniform | Uniform | Uniform |  | Uniform |
|  | Diameter: 5 μm | | | | Uniform | |
| Particle Number Density(particles/mm²) | | 16000 | 16000 | 16000 | 16000 | 10000 |
| Bump Height | | 15 | 12 | 8 | 10 | 8 |
| Inter-Bump Cross Sectional Area (μm) | | 112.5 | 90 | 60 | 75 | 60 |
| Minimum Inter-Particle Distance (μm) | | 2.1 | 1.6 | 1.1 | 1 | 3 |
| Maximum Inter-Bump Particles (Planer Perspective) | | 3 | 3 | 2 | 1 | 1 |
| Trapped Particles | Average | 10.9 | 10.7 | 10.9 | 10.5 | 7.2 |
|  | Minimum | 9 | 9 | 9 | 9 | 6 |
| Resistance (Ω) | Initial | 0.2 | 0.2 | 0.2 | 0.2 | 0.2 |
|  | Post-Reliability-Test | 5 Ω or less | 5 Ω or less | 5 Ω or less | 5 Ω or less | 5 Ω or less |
| Inter-Bump Short Circuit (ppm) | | 10 ppm or less | 10 ppm or less | 10 ppm or less | 10 ppm or less | 10 ppm or less |

|  |  | Ex. 6 | Comp. 1 | Comp. 2 | Comp. 3 |
|---|---|---|---|---|---|
| Phenoxy Resin | | 60 | 60 | 60 | 60 |
| Epoxy Resin | | 40 | 40 | 40 | 40 |
| Cation-Type Curing Agent | | 2 | 2 | 2 | 2 |
| Conductive Particles | Diameter: 3 μm | Uniform | | | |
|  | Diameter: 4 μm | | Random | Random | |
|  | Diameter: 5 μm | | | | Uniform |
| Particle Number Density (particles/mm²) | | 60000 | 16000 | 16000 | 16000 |
| Bump Height | | 8 | 15 | 8 | 8 |
| Inter-Bump Cross Sectional Area (μm) | | 60 | 112.5 | 60 | 60 |
| Minimum Inter-Particle Distance (μm) | | 0.5 | 0 | 0 | 0.5 |
| Maximum Inter-Bump Particles (Planer Perspective) | | 4 | 7 | 6 | 1 |
| Trapped Particles | Average | 37.5 | 9.6 | 6.1 | 10.7 |
|  | Minimum | 25.1 | 7 | 5 | 9 |
| Resistance (Ω) | Initial | 0.2 | 0.2 | 0.2 | 0.2 |
|  | Post-Reliability-Test | 5 Ω or less | 5 Ω or less | 5 Ω or less | 5 Ω or less |
| Inter-Bump Short Circuit (ppm) | | 40 ppm or less | 3000 | 5000 | 60 |

As represented in table 1, in the connection body samples of Examples 1 to 6, the average number of conductive particles trapped between each evaluation-use IC bump and each evaluation-use glass substrate electrode was at least 7.2, initial electrical resistances were 0.2Ω and post-reliability-test electrical resistances were 5Ω or less, and favorable results were achieved. Furthermore, in the connection body samples of Examples 1 to 6, the numbers of conductive particles in inter-bump spaces were 1 to 4 at most, inter-particle distances were 0.5 to 2.1 μm and the occurrence rates for inter-bump short circuits were 40 ppm or less so that favorable results were achieved for insulating properties.

In contrast, in Comparative Example 1, because the conductive particles were randomly dispersed in the binder resin layer, the maximum number of conductive particles in inter-bump spaces was 7 and minimum inter-particle distance was 0 μm such that conductive particles were continuous and the occurrence rate for inter-bump short circuits was 3,000 ppm.

Furthermore, in Comparative Example 2, bump height was low at 8 μm and cross-sectional area for inter-bump space was 60 μm²; due to being narrower and smaller than the Comparative Example 1, the maximum number of conductive particles in inter-bump spaces was 6 and the occurrence rate for inter-bump short circuits was 5,000 ppm.

In Comparative Example 3, an anisotropic conductive film was used in which conductive particles were uniformly arranged; however, the conductive particles had a diameter (5 μm) which was larger than ½ of bump height (8 μm). Consequently, continuous conductive particles occurred in inter-bump spaces and the occurrence rate of inter-bump short circuits was 60 ppm. Thus, it can be understood that a diameter of the conductive particles is preferably at most ½ of the height of the bumps.

It should be noted that, in Example 5, although the number density of the conductive particles was 10,000 particles/mm², at least 6 particles were trapped, which did not represent a practical problem since the border for defect is 4 or less trapped particle. Furthermore, in Example 6, although the number density of the conductive particles was 60,000 particles/mm², the inter-bump short circuit occurrence rate was at most 40 ppm, which did not represent a practical problem since the border for defects is a rate of 50 ppm or more. Thus, the number density of the conductive particles in the anisotropic conductive film can be understood to be preferably from 10,000 to 60,000 particles/mm².

REFERENCE SIGNS LIST 1 anisotropic conductive film, 2 release-treated film, 3 binder resin layer, 4 conductive particles, 6 winding reel, 10 liquid crystal display panel, 11, 12 transparent substrate, 12a edge area, 13 seal, 14 liquid crystal, 15 panel display unit, 16, 17 transparent electrodes, 17a terminal portions, 18 liquid crystal driver IC, 18a mounting surface, 19 electrode terminals, 20 COG mounting portion, 21 substrate-side alignment mark, 22 IC-side alignment mark, 33 thermocompression head

The invention claimed is:

1. A connection body comprising: an electronic component connected onto a circuit substrate via an anisotropic conductive adhesive agent; wherein the anisotropic conductive adhesive agent has conductive particles that are uniformly spaced; and wherein the conductive particles have a particle diameter that is ½ or less than a height of a connecting electrode of the electronic component, wherein the conductive particles comprise resin particles having a metal coated on the surface thereof.

2. The connection body according to claim 1, wherein the conductive particles of the anisotropic conductive adhesive agent have a number density from 10,000 to 60,000/mm$^2$.

3. The connection body according to claim 2, wherein the conductive particles are arranged in a grid pattern.

4. The connection body according to claim 1, wherein the conductive particles are arranged in a grid pattern.

5. A method for manufacturing a connection body comprising: mounting an electronic component onto a circuit substrate via an adhesive agent containing conductive particles; and pressing the electronic component against the circuit substrate and curing the adhesive agent, thereby connecting the electronic component to the circuit substrate; wherein the anisotropic conductive adhesive agent has conductive particles that are uniformly spaced; and wherein the conductive particles have a particle diameter that is ½ or less than a height of a connecting electrode of the electronic component, wherein the conductive particles comprise resin particles having a metal coated on the surface thereof.

6. The method for manufacturing a connection body according to claim 5, wherein the conductive particles comprise resin particles having a metal coated on the surface thereof.

7. A connecting method comprising: mounting an electronic component onto a circuit substrate via an adhesive agent containing conductive particles; and pressing the electronic component against the circuit substrate and curing the adhesive agent, thereby connecting the electronic component to the circuit substrate; wherein the anisotropic conductive adhesive agent has conductive particles that are uniformly spaced; and wherein the conductive particles have a particle diameter that is ½ or less than a height of a connecting electrode of the electronic component, wherein the conductive particles comprise resin particles having a metal coated on the surface thereof.

8. The connecting method according to claim 7, wherein the conductive particles comprise resin particles having a metal coated on the surface thereof.

9. An anisotropic conductive adhesive agent to be pasted, along with mounting of an electronic component, to a surface of a circuit substrate as an anisotropic conductive adhesive agent for connecting the electronic component to the circuit substrate comprising: conductive particles that are uniformly spaced; wherein the conductive particles have a particle diameter that is ½ or less than a height of a connecting electrode of the electronic component, wherein the conductive particles comprise resin particles having a metal coated on the surface thereof.

10. The anisotropic conductive adhesive agent according to claim 9, wherein the conductive particles comprise resin particles having a metal coated on the surface thereof.

* * * * *